OPERATIONAL AMPLIFIER HAVING IMPROVED OVERLOAD RECOVERY

Filed Oct. 8, 1965 2 Sheets-Sheet 1

INVENTOR.
EDWARD O. GILBERT
BY

July 15, 1969 E. O. GILBERT 3,456,203

OPERATIONAL AMPLIFIER HAVING IMPROVED OVERLOAD RECOVERY

Filed Oct. 8, 1965 2 Sheets-Sheet 2

INVENTOR.
EDWARD O. GILBERT
BY

United States Patent Office 3,456,203

Patented July 15, 1969

3,456,203

OPERATIONAL AMPLIFIER HAVING IMPROVED OVERLOAD RECOVERY

Edward O. Gilbert, Ann Arbor, Mich., assignor to Applied Dynamics, Inc., Ann Arbor, Mich., a corporation of Michigan Continuation-in-part of application Ser. No. 471,790, July 9, 1965. This application Oct. 8, 1965, Ser. No. 494,148

Int. Cl. H03f 1/02, 3/18, 3/04

U.S. Cl. 330—9 17 Claims

ABSTRACT OF THE DISCLOSURE

An arrangement for decreasing the overload recovery time of a DC operational amplifier and limiting overload conditions which includes means for monitoring a voltage within the DC amplifier channel to operate a current control means when the monitored voltage within the amplifier exceeds a predetermined limit value, with operation of the current control device connected to apply heavy negative feedback current to the amplifier summing junction to limit voltage excursions within the amplifier. An overload indicating circuit responsive to a voltage excursion within the DC amplifier channel is arranged to provide an overload indication signal at a lower predetermined limit value, so that limiting the amplifier voltage excursions does not prevent derivation of an overload indicating signal.

Figure 1:
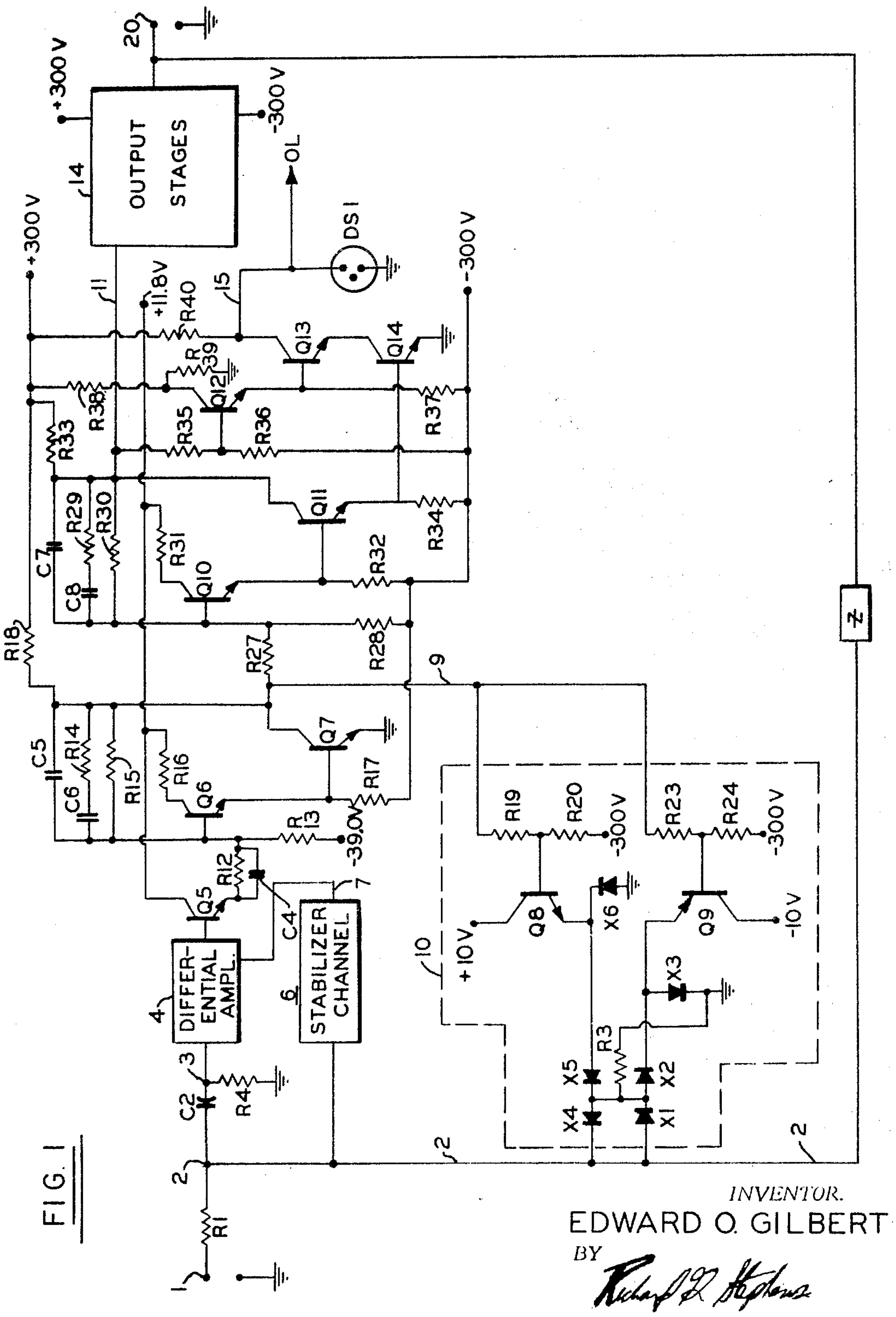

This invention relates to electronic computer circuits, and more particularly, to a novel feedback operational amplifier incorporating an improved system for decreasing the time required for recovery from overloads. This application is, in some respects, a continuation-in-part of my prior copending application Ser. No. 471,790, filed July 9, 1965.

Modern electronic analog computer systems generally comprise a plurality of stabilized feedback operational amplifiers which are interconnected with various other computing circuits, such as multipliers, function generators, switches and the like, into complex multi-loop circuits, with the interconnections utilized during the solution of a given problem depending upon the nature of the equation to be solved, and with the interconnections usually established by means of a patchboard.

Stabilized operational amplifiers conventionally comprise a main amplifier channel including direct-coupled high-frequency stages for amplifying signal components above zero frequency, and a stabilizer channel to amplify zero frequency and some low frequency components. As is well known, such dual channel amplifiers combine the superior high-frequency response of the direct-coupled amplifier channel and the drift-minimizing advantage of the modulated-carrier RC-coupled stages of the stabilizer channel.

Because many problems requiring solution defy ready analysis, computer scaling frequently must be done by trial and error. Selection of large scale factors degrades computer accuracy, but selection of scale factors which are too small frequently results in one or more amplifier circuits being driven into an overload condition. Also, it is very convenient for certain iterative types of calculations to repetitively solve a problem, stopping each computer run when one or more quantities reach limit values, and for efficient use of the computer, such limit values are usually near the operating limits of one or more of the amplifiers of the computer. The overload of a stabilized operational amplifier conventionally has been indicated in the prior art by means of an overload indicator lamp which becomes illuminated when its associated amplifier overloads, in order that the operator will recognize that the computation is inaccurate.

Overloads result not only from scaling errors, but also from the connection of a too-heavy load to an amplifier, or from erroneous connection of a too-high or too-low voltage to either an input or output terminal of an amplifier.

If a typical stabilized amplifier is driven very far into an overload condition, a number of fairly large capacitors may become charged to rather high voltage levels, and due to the necessarily large time-constants of the circuits involving such capacitors, a long recovery time then will be required after removal of the cause of the overload before such capacitors discharge and the amplifier can resume computation at normal accuracies. Such long time-constant circuits usually include a DC blocking capacitor high-pass filter circuit situated between the summing junction and first stage of the main amplifier channel, and the low-pass filters usually used adjacent the modulator and demodulator of the stabilizer channel.

One prior art obvious method of decreasing overload recovery time has been the use of oppositely-poled diodes at the blocking capacitor, and at the stabilizer output filter capacitor. One or the other of each pair of such diodes will conduct whenever the voltage across a pair exceeds the diode threshold potential, thereby limiting the voltage to a low value, so that recovery time is decreased. The diode threshold may be established by a fixed bias source, or may comprise the diode contact potential if high quality silicon diodes are available. Upon removal of an overload, diodes which parallel a capacitor leave the capacitor charged to the level of the diode threshold or contact potential, and an appreciable recovery time is required before computation with normal accuracy can resume. With the time-constants generally used in typical operational amplifiers, the .5 to 1.0 volt potentials left on such capacitors by present-day silicon diodes frequently require recovery times of the order of 10 to 30 seconds before computation can resume at normal accuracies. The quick-recovery scheme shown in my above-mentioned copending application offered a considerable improvement, so that computation with normal accuracy could be resumed in approximately 1 second. The present invention improves recovery time even further, so that computation with normal accuracy may be resumed even more quickly, in about 0.2 second. Thus, it is a primary object of the present invention to provide an improved stabilized amplifier having a reduced recovery time.

Furthermore, the present invention offers marked advantages over both the parallel-diode scheme and my prior system in that the computation performed with the present invention during its brief, fraction-of-a-second recovery time, is much more accurate than that performed by prior systems during almost their entire, relatively-long recovery times. In fact, the errors introduced during the extremely brief recovery period of the present invention are small enough to be ignored in many computing applications, so that almost zero computing time need be lost after removal of any overload to allow for recovery from an overload in such applications of the invention. Thus it is another object of the present invention to provide an improved stabilized amplifier which not only features a reduced recovery time, but which computes with much less error during the interval between the time an overload is removed and the time by which the amplifier has recovered sufficiently to begin computation with its normal accuracy.

The present invention incorporates a feedback limiter which applies a corrective signal to the amplifier summing junction when the amplifier reaches an overload condition. In the prior art, pairs of oppositely-poled Zener diodes frequently have been connected between the output terminal and summing junction of feedback amplifiers, so that one such diode will fire and limit amplifier output voltage when the amplifier output voltage exceeds a predetermined level. While such prior systems may prevent voltages within the amplifier from exceeding allowable limits by monitoring the amplifier output voltage, they disadvantageously fail to provide any indication of an overload, so that grossly inaccurate computation may occur with such amplifiers, with the operator wholly unaware that the computation is so erroneous as to be meaningless. Such prior systems are further disadvantageous in that they are responsive only to overvoltage types of overloads and not to overcurrent. The connection of an extremely heavy load to such an amplifier might so overload the amplifier that computation becomes extremely inaccurate, but no Zener diode will fire because all amplifier voltages will tend to remain low. The present invention overcomes such disadvantages of that prior art scheme, allowing provision of an overload indicating signal for either indicating to an operator that an overload has occurred, or for initiating computer control, or for both purposes. The use of amplifier overload signals for automatic computer control are shown and described in application Ser. No. 404,895 filed October 19, 1964, by L. E. Fogarty and R. M. Howe, now Patent No. 3,370,159 issued February 20, 1968, and assigned to the same assignee as the present invention. Thus it is a further important object of the present invention to provide a stabilized amplifier having a reduced recovery time which is capable of providing overload signals which may be used for indication and/or control.

Other objects of the invention will in part be obvious and will in part appear hereinafter.

The invention accordingly comprises the features of construction, combination of elements, and arrangement of parts, which will be exemplified in the construction hereinafter set forth, and the scope of the invention will be indicated in the claims.

Figure 2:
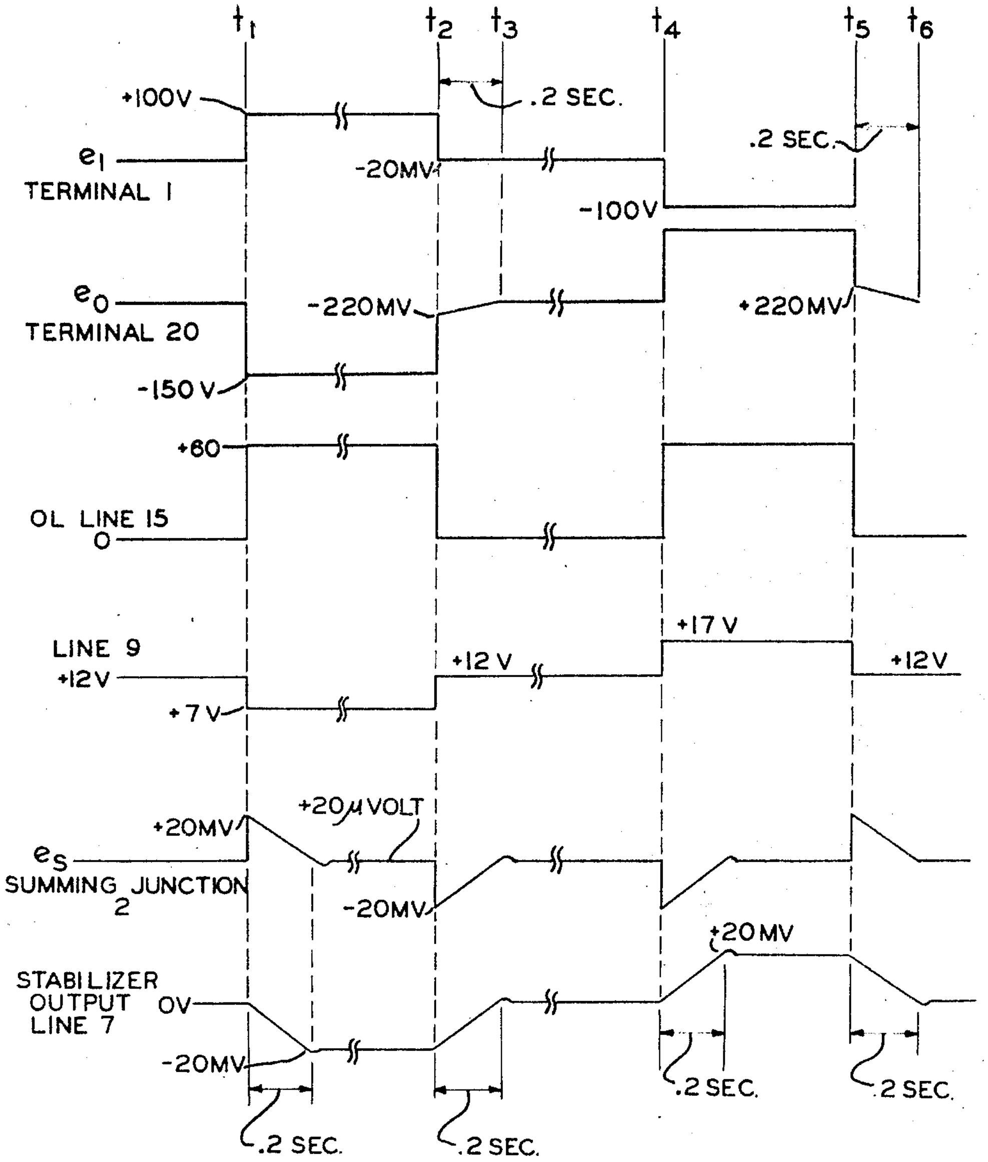

For a fuller understanding of the nature and objects of the invention reference should be had to the following detailed description taken in connection with the accompanying drawings, in which:

FIG. 1 is an electrical schematic diagram of an exemplary embodiment of the invention, with certain parts shown in block form; and FIG. 2 is a group of waveform diagrams useful in understanding the operation of the invention. For convenience, portions of FIG. 2 are drawn not to scale.

FIG. 1 illustrates an exemplary adaptation of the present invention to a transistorized operational amplifier similar in most other respects to the amplifier disclosed in my above-mentioned copending application. An input circuit shown as comprising single resistance R1 is shown connected to apply input currents resulting from input potentials applied to input terminal 1 to the amplifier summing junction 2. Frequently various other types of input circuits are used to apply input currents to summing junction 2. A feedback impedance Z is shown connected between the amplifier output terminal 20 and summing junction 2.

The signal at terminal 2 is applied via a high-pass filter comprising blocking capacitor C2 and resistor R4 to apply non-zero frequency components of the summing junction signal to a signal difference-determining device indicated in block 4 as comprising a differential amplifier. The signal on summing junction 2 is also modulated, amplified, and then demodulated in stabilizer channel 6, to provide a re-balancing or drift-correction signal on line 7 which varies with the zero-frequency and some low frequency components of the summing junction signal. Blocking capacitors such as C2 are not used in some operational amplifiers, and the C2–R4 high-pass filter is not an essential part of the present invention.

The output signal from differential amplifier 4 is further amplified in several amplifying stages shown in detail and eventually applied to drive output stages represented in block form at 14, to provide the amplifier output signal at terminal 20. The main channel of the amplifier, which channel is direct-coupled, comprises that portion of the circuitry between terminal 3 and output terminal 20. While a variety of different circuits are available to algebraically sum the input signal at terminal 3 and the drift-correction or lof frequency signal derived by stabilizer channel 6, the invention may advantageously employ the improved differential amplifier stage of my copending application. In one suitable embodiment of my invention, the differential amplifier stage is provided with a gain of approximately 4, the remaining direct-coupled stages of the main channel are provided with a gain of 25,000 at DC, and the stabilizer channel is provided with a DC gain of approximately 1000.

The output signal from differential amplifier 4 is applied to emitter follower transistor Q5, which minimizes loading on the low current level differential amplifier. The output signal from emitter follower Q5 is applied in succession to two Darlington pairs including transistors Q6 and Q7 in one pair and Q10 and Q11 in the other pair. Each pair provides a considerable amount of current gain and is shown provided with local negative feedback to make its gain characteristic tend to be independent of changes in transistor characteristics. The local negative feedback paths around Q6 and Q7 include resistor R15, capacitor C6 and resistor R14, and capacitor C5. The output signal from the collector of Q7 of the first Darlington pair is applied via resistor R27 to the base of transistor Q10 of the second pair. The output signal from the collector of transistor Q11 present on terminal 11 is applied to an output stage contained within block 14, and also applied, as will be explained below, to provide a "fast" overload signal useful both for illuminating indicator DS1 and for computer control via control line OL. The overload signal will appear on line 15 and will illuminate neon lamp DS1 whenever the voltage at the Q7 collector varies outside a first set of limit values. As well as being applied to drive the second Darlington pair, the output signal on the Q7 collector is applied to comparison means which operate to sense any excursion of the Q7 collector voltage outside a second set of limit values and operate to control the application of a negative feedback signal to summing junction 2 to limit amplifier signal voltages at the amplifier input and output terminals and also within both amplifier channels. The first set of limit values, which values determine overload indication, are selected to be slightly less than the second set of limit values which control the application of negative feedback limiting.

During normal computer "not overload" operation, the voltage on line 11 varies between approximately 20–60 volts, and transistors Q12, Q13 and Q14 are all normally biased on. The current drawn by Q11 through resistor R33 biases on Q14. If an overload causes the Q11 collector to be driven toward an extreme in one direction, i.e., into saturation, so that the Q11 collector voltage falls toward zero, the base input signal to transistor Q12 will be seen to swing negatively, eventually to the point where normally-conducting transistor Q12 will be cut off, thereby shutting off transistor Q13. If instead, an overload causes the Q11 collector to be driven toward an extreme in the opposite direction, i.e., toward cutoff of transistor Q11, the change in voltage drop across R34 will turn off transistor Q14, thereby turning off transistor Q13. Thus, it will be seen that an overload in either direction will turn off transistor Q13. Resistors R40, R37 and R34 are selected so that the Q13 collector normally lies near zero volts with Q13 conducting in the absence of an overload. When an overload cuts off transistor Q13, the voltage on line 15 rises to approximately 60 volts, the firing voltage of DS1. An advantage of the circuit is that the overload signal on line 15 is "absolute" in nature, i.e., that it goes in the same direction upon the occurrence of an overload, irrespective of the direction of the overload. It also may be noted that transistors Q12, Q13 and Q14 are all direct-coupled to the Q11 collector without any long time-constant circuitry, and hence the overload signal on line 15 appears substantially instantaneously upon the occurrence of an overload. The overload signal on line 15 is shown connected to illuminate neon indicator lamp DS1, and also available to be applied via overload line OL for use as a logic or switching signal, if desired.

In accordance with the invention, an overload indication is produced whenever a selected "internal" voltage within the direct-coupled channel experiences an excursion outside a first pair of limit values. The internal voltage which is monitored may be any signal voltage in the main amplifier channel from the output of the difference-determining stage to and including the input of the last amplifying stage. In general it is convenient to monitor the voltage one or more stages past the differential stage, where signal swings are easily detected and are great enough to operate indicators and switching circuits without additional amplification.

To provide quick recovery from overloads in accordance with the invention, the signal voltage swing within the amplifier main channel is also monitored by a comparison means which applies negative feedback to the amplifier summing junction when the voltage swing within the amplifier exceeds a second set of limit values. In FIG. 1, the Q7 collector voltage on line 9 has a quiescent value of +12.0 volts which is established by the resistors (R12, R13, R15) associated with Q7, and the signal swing at line 9 is of the order of 0.3 volt maximum for normal operation. When the signal swing on line 9 approximates 1 volt in either direction from the 12 volt quiescent value, an overload indication is produced by cutoff of the Q13 transistor in the manner described above. Thus the first set of limit values, at which an overload indication is produced, are approximately +13 and +11 for the Q7 collector voltage in FIG. 1. When the signal excursion on line 9 amounts to approximately 5 volts in either direction from the 12 volt quiescent value, negative feedback limiting is provided by comparison and switching means shown within dashed lines at 10. Thus the second set of limit values, outside of which feedback limiting occurs, are +17 and +7 volts in the specific embodiment of FIG. 1 being described.

When line 9 lies at its normal 12 volt value, the voltage divider formed by resistors R19 and R20 establish the Q8 base voltage at −3 volts so that Q8 remains cutoff, and the voltage divided formed by resistors R23 and R24 establish the Q9 base potential at about 3.5 volts, so that Q9 also remains cutoff, and hence no negative feedback path then exists through circuit 10 to summing junction 2. The emitters of Q8 and Q9 will be seen to float at essentially zero volts, their exact voltages depending upon the relative impedances of diode pairs.

If an overload occurs in a direction so as to cause the Q7 collector voltage to go positive, the indicator circuit will be energized when line 9 reaches approximately +13 volts, in the manner described above. As the voltage on line 9 reaches approximately +17 volts, the Q8 base will rise to approximately +1.7 volts, so that Q8 begins to conduct, and so that the Q8 emitter rises from its normal zero value to approximately 1.1 volts, and a negative feedback (positive current) signal will be applied to summing junction 2 via diodes X5 and X4. The rise of line 9 to +17 volts raises the Q9 base to +6.5 volts, so that transistor Q9 remains cutoff, ever harder.

If, instead, an overload occurs in the opposite direction, as the voltage on line 9 falls from its quiescent value of +12 down to +7, the Q8 base will be driven downwardly from −3 to −7, so that Q8 will be cutoff, but the drop of the Q9 base voltage from +3.5 to −1.7 will turn on Q9, so that a negative feedback (negative current) will flow from summing junction 2 through diodes X1 and X2 to the Q9 emitter. In either case, the considerable gain (e.g. 250 at high frequencies, 250,000 at DC) in the limiter loop shown results in "hard limiting," so that the Q7 collector voltage cannot appreciably exceed the ±5 volt operating range.

Resistor R3 and diodes X–1, X–2, X–4 and X–5 are shown being used in a series-shunt circuit with the Q8 and Q9 emitters in FIG. 1 solely beacuse of leakage in the transistors and diodes. Various other isolation schemes can readily be substituted by those skilled in the art where leakage is serious enough to degrade amplifier operation. In normal amplifier operation R3 holds the junction of X1, X2, X4 and X5 at several millivolts. In this case the leakage current through X4 and X1 to the summing junction is less than $5\times10^{-12}$ amps. Diodes X–3 and X–6, which are quite optional and not part of the present invention, are provided to protect the amplifier input stage transistor from the burnout which otherwise might result if a large voltage were accidentally patched to summing junction 2.

While FIG. 1 shows the output signal of transistor Q7 driving indicator DS1 via a circuit (Q10 through Q14) separate from the negative feedback limiting control circuit (Q8, Q9), it is quite within the scope of the invention to derive overload indicating signals from the Q8 and Q9 circuits or equivalent comparison circuits. It will be recognized, however, that any signals associated with the Q8 and Q9 circuits must be considerably amplified to operate any conventional neon indicator, and furthermore, an inverting stage and an OR circuit are necessary if an overload in either direction is required to operate a single overload indicator or energize a single overload control line.

A better quantitative understanding of the operation of the invention now may be had by reference to the graphic diagrams of FIG. 2. Suppose that the amplifier of FIG. 1 is provided with a feedback resistor Z which is ten times the resistance of input resistor R1, so that the amplifier is intended to have an over-all gain of 10. Now assume that, as shown at waveform $e_i$ and at time $t_1$ in FIG. 2, an input voltage $e_i$ of +100 volts is applied to input terminal 1. The amplifier, having been designed for computation over a ±100 volt computing range, obviously will saturate as it attempts to provide a mathematically correct output voltage of 1000 volts. A typical amplifier, as shown by output waveform $e_o$ in FIG. 2, will saturate at some voltage greater than −100 volts but much less than −1000 volts, and in FIG. 2 a saturation level of −150 volts is shown. As shown by the fourth and third waveforms, respectively, the Q7 collector voltage on line 9 and the overload logic control voltage on line 15 will drop to +7 volts and rise to +60 volts, respectively, and as suggested by the steep wavefronts at $t_1$, these changes occur substantially instantaneously.

Patching of the overvoltage to terminal 1 will cause an immediate error signal $e_S$ at summing junction 2. The high frequency loop voltage gain of the closed loop including differential amplifier 4, Q5, Q6, Q7 and either Q8 or Q9 back to summing junction 2 may be established at a value of 250, for example, so that the 5 volt excursion on line 9 before limiting takes place allows a 5/250 or 20 millivolt immediate excursion at summing junction 2. The low frequency gain of the stabilizer channel will immediately begin to integrate out the unbalance, however, and with a stabilizer channel DC gain of 1000, summing junction 2 will be driven to about 20 microvolts, or essentially zero, in the stabilizer response time, shown as being approximately 0.2 second in FIG. 2, with a small overshoot, as the stabilizer channel output voltage increases from zero to −20 millivolts. The circuit then will remain fixed at the conditions mentioned until the overload is removed. In FIG. 2 the uppermost waveform shows the +100 volt input signal removed at $t_2$, the instant from which the amplifier overload recovery time is measured.

When the overloading input to terminal 1 is removed at time $t_2$ the stabilizer channel will be applying −20 millivolts to differential amplifier 4, so that the summing junction voltage goes immediately to −20 mullivolts upon removal of the overload. The Q7 collector (line 9) voltage is immediately restored to some voltage very near +12 volts, within the normal amplifier operating range. As the stabilizer channel responds over its .2 second response period, both the summing junction voltage and the stabilizer output voltage then will decrease in ramp fashion to essentially zero. With the summing junction at −20 millivolts as soon as the overload input is removed and the input terminal 1 then at zero, it may be seen from the input-feedback impedance ratio that the amplifier output voltage will equal (−20 mv.)+(−200 mv.), or −220 millivolts as soon as the overload is removed, and that this voltage will decrease to substantially zero during the 0.2 second recovery period between $t_2$ and $t_3$, after which the amplifier will be fully recovered. Even before the end of the 0.2 second period, the amplifier output will be sufficiently near its proper value (shown as zero in the example assumed) for computation to be regarded as sufficiently accurate for many applications.

FIG. 2 also shows an opposite sense overload input voltage being applied at time $t_4$, and removed at time $t_5$ to allow complete recovery between time $t_5$ and $t_6$, and these portions of FIG. 2 will be obvious in view of the previous explanation. Frequently removal of an overload may amount to reduction of an input voltage to some finite value other than the zero volts shown in the example, and recovery of the amplifier to its proper level under such circumstances will occur, of course, in similar manner. The manner in which the amplifier recovers from overloads due to heavy loads or voltage sources being connected to the output terminals also will be readily apparent in view of the preceding illustrations.

It will be apparent to those skilled in the art that the invention is applicable to vacuum-tube amplifiers as well as transistorized amplifiers.

It will thus be seen that the objects set forth above, among those made apparent from the preceding description, are efficiently attained, and since certain changes may be made in the above constructions without departing from the scope of the invention, it is intended that all matter contained or shown in the accompanying drawings shall be interpreted as illustrative and not in a limiting sense.

Having described my invention, what I claim as new and desire to secure by Letters Patent is:

1. In a DC amplifier operable to receive an input voltage at an input terminal and to provide an output voltage at an output terminal and wherein said amplifier comprises a plurality of cascaded amplifying stages direct-coupled to each other including a first amplifying stage having an input circuit connected to said input terminal and a last amplifying stage having an output circuit connected to said output terminal, first circuit means for applying an input current to said input terminal, second circuit means for connecting a feedback impedance between said output terminal and said input terminal, said amplifying stages collectively providing a high value of negative gain whereby the current through said feedback impedance is substantially equal in magnitude and opposite in sense to said input current and the potential at said input terminal is maintained substantially at a first reference potential level, whereby successive ones of said cascaded amplifying stages provide respective output signal voltages related to each other in accordance with the respective gains of successive ones of said cascaded amplifying stages when a given value of said input voltage is applied to said input terminal during normal operation of the amplifier, and whereby the output signal voltage of a predetermined one of said amplifying stages other than said last amplifying stage becomes more positive than a second reference potential level or more negative than a third reference potential level during abnormal operation of said amplifier, the combination of first electronic current-controlling means biased to a non-conducting condition during normal operation of said amplifier, third circuit means for applying an output signal voltage from one of said amplifying stages other than said last amplifying stage to said first electronic current-controlling means to switch said first electronic current-controlling means to a conducting condition when the output signal voltage from said predetermined one of said amplifying stages becomes more positive than said second reference potential level, said first electronic current-controlling means being connected upon conduction to apply current having a first polarity to said input terminal to limit the excursion above said second reference potential level of said output signal voltage of said predetermined one of said amplifying stages, second electronic current-controlling means biased to a non-conducting condition during normal operation of said amplifier, fourth circuit means for applying an output signal voltage from one of said amplifying stages other than said last amplifying stage to said second electronic current-controlling means to switch said second electronic current-controlling means to a conducting condition when the output signal voltage of said predetermined one of said amplifying stages becomes more negative than said third reference potential level, said second electronic current-controlling means being connected upon conduction to apply current having a polarity opposite from said first polarity to said input terminal to limit the excursion below said third reference potential level of said output voltage of said predetermined one of said amplifying stages.

2. An amplifier in accordance with claim 1 in which said input circuit includes a high-pass filter circuit.

3. An amplifier according to claim 1 having a diode connected in series with said first electronic current-controlling means and said input terminal.

4. An amplifier according to claim 1 including drift-stabilizing means responsive to the potential at said input terminal and operative to apply a rebalancing signal to said first amplifying stage.

5. An amplifier according to claim 4 in which said first amplifying stage comprises a difference-determining circuit having a second input terminal and in which said drift-stabilizing means is connected to apply said rebalancing signal to said second input terminal of said difference-determining circuit.

6. An amplifier according to claim 1 in which said first circuit means comprises a linear resistance.

7. An amplifier according to claim 1 in which said feedback impedance comprises a resistance.

8. An amplifier according to claim 1 in which said feedback impedance comprises a capacitor.

9. An amplifier according to claim 1 including further circuit means for providing an overload indicating signal, said further circuit means including an electronic switching means, means for applying first and second bias potentials to said electronic switching means, means for applying an output voltage selected from one of said amplifying stages other than said last amplifying stage to said electronic switching means, the magnitudes of said first and second bias potentials applied to said electronic switching means being selected so that the output voltage applied to said electronic switching means changes the conduction state of said electronic switching means when said output voltage from said predetermined one of said amplifying stages becomes more positive than a fourth reference potential level, and so that the output voltage applied to said electronic switching means changes the conduction state of said electronic switching means when said output voltage from said predetermined one of said amplifying stages becomes more negative than a fifth reference potential level, said fourth reference potential level being less positive than said second reference potential level and said fifth reference potential being less negative than said third reference potential level, and means responsive to the conduction state of said electronic switching means for providing said overload indicating signal.

10. An amplifier according to claim 9 in which said means responsive to the conduction state of said electronic switching means comprises a neon lamp.

11. An amplifier according to claim 9 in which said electronic switching means includes a first switching device responsive to said selected output voltage and to a third bias potential for providing a first signal when said selected output voltage overcomes the effect of said third bias potential, a second switching device responsive to said selected output voltage and to a fourth bias potential for providing a second signal when said selected output voltage overcomes the effect of said fourth bias potential, and a third switching device connected to have its conduction state changed in response to occurrence of either said first signal or said second signal to provide said overload indication signal.

12. An amplifier according to claim 1 in which said first electronic current-controlling means includes a transistor having a base terminal and a collector-emitter circuit, said collector-emitter circuit being connected between a first current source and said input terminal, said third circuit means being connected to apply voltage to said base terminal, and means for applying a bias potential to said base terminal.

13. The combination according to claim 1 wherein each of said electronic current-controlling means comprises amplifying means having greater-than-unity current gain.

14. The combination according to claim 1 in which said third and fourth circuit means are each connected to the output circuit of the same one of said cascaded amplifying stages.

15. In a DC amplifier operable to receive an input voltage at an input terminal and to provide an output voltage at an output terminal and wherein said amplifier comprises a plurality of cascaded amplifying stages direct-coupled to each other, including a first amplifying stage having an input circuit connected to said input terminal and a last amplifying stage having an output circuit connected to said output terminal, first circuit means for applying an input current to said input terminal, second circuit means for connecting a feedback impedance between said output terminal and said input terminal, said amplifying stages collectively providing a high value of negative gain whereby the current through said feedback impedance is substantially equal in magnitude and opposite in sense to said input current and the potential at said input terminal is maintained substantially at a first reference potential level, whereby successive ones of said cascaded amplifying stages provide respective output voltages related to each other in accordance with the respective gains of successive ones of said cascaded amplifying stages when a given value of said input current is applied to said input terminal during normal operation of the amplifier and whereby the output voltage of a predetermined one of said amplifying stages other than said last amplifying stage tends to exceed a second reference potential level during abnormal operation of said amplifier, the combination of first electronic current-controlling means biased to a non-conducting condition during normal operation of said amplifier, third circuit means for applying a voltage which varies in accordance with the output voltage of one of said amplifying stages other than said last amplifying stage to said first electronic current-controlling means to switch said first electronic current-controlling means to a conducting condition when the output voltage of said predetermined one of said amplifying stages tends to exceed said second reference potential level, said first electronic current-controlling means being connected upon conduction to apply current to said input terminal, thereby to limit the excursion beyond said second reference potential level of said output voltage of said predetermined one of said amplifying stages.

16. The combination according to claim 15 having a second electronic current-controlling means biased to a non-conducting condition during normal operation of said amplifier, fourth circuit means for applying a voltage which varies in accordance with the output voltage of one of said amplifying stages other than said last amplifying stage to said second electronic current-controlling means to switch said second electronic current-controlling means to a conducting condition when the output voltage of said predetermined one of said amplifying stages tends to become less than a third reference potential level, said second electronic current-controlling means being connected upon conduction to apply current to said input terminal, thereby to limit the excursion below said third reference potential level of said output voltage of said predetermined one of said amplifying stages.

17. The combination according to claim 16 in which said first and second electronic current-controlling means each comprise transistor amplifying means.

References Cited

UNITED STATES PATENTS

| | | | |
|---|---|---|---|
| 3,147,446 | 9/1964 | Wittenberg | 330—9 |
| 3,222,607 | 12/1965 | Patmore | 330—9 |
| 3,237,117 | 2/1966 | Collins et al. | 330—9 |
| 2,801,296 | 7/1957 | Blecher | 330—9 |

NATHAN KAUFMAN, Primary Examiner

U.S. Cl. X.R.

330—17, 24